United States Patent
Kenzaki (10) Patent No.: US 10,436,816 B2
(45) Date of Patent: Oct. 8, 2019

(54) TEST COAXIAL CONNECTOR

(71) Applicant: Murata Manufacturing Co., Ltd., Kyoto-fu (JP)

(72) Inventor: Shinichi Kenzaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/192,578

(22) Filed: Nov. 15, 2018

(65) Prior Publication Data
US 2019/0086442 A1 Mar. 21, 2019

Related U.S. Application Data

(63) Continuation of application No. PCT/JP2017/018593, filed on May 17, 2017.

(30) Foreign Application Priority Data

May 26, 2016 (JP) ................................. 2016-105189

(51) Int. Cl.
*H01R 9/05* (2006.01)
*G01R 1/04* (2006.01)
*H01R 24/38* (2011.01)
*H01R 13/24* (2006.01)
*H01R 24/46* (2011.01)

(52) U.S. Cl.
CPC ....... *G01R 1/0408* (2013.01); *H01R 13/2442* (2013.01); *H01R 24/38* (2013.01); *H01R 24/46* (2013.01); *G01R 1/0416* (2013.01); *H01R 2201/20* (2013.01)

(58) Field of Classification Search
CPC ...... G01R 1/0408; H01R 24/38; H01R 24/42; H01R 2201/20
USPC ................................. 439/578, 219, 482, 912
See application file for complete search history.

(56) References Cited

U.S. PATENT DOCUMENTS 8,414,328 B2 * 4/2013 Yamakoshi .......... H01R 9/0518
439/188
2005/0048823 A1 3/2005 Barlerin et al.

FOREIGN PATENT DOCUMENTS

| JP | H06-5158 U | 1/1994 |
|---|---|---|
| JP | 2004-362832 A | 12/2004 |
| JP | 2007-139712 A | 6/2007 |
| JP | 2008-198532 A | 8/2008 |
| JP | 2011-106980 A | 6/2011 |

(Continued)

OTHER PUBLICATIONS

International Search Report issued in PCT/JP2017/018593; dated Aug. 8, 2017.
Written Opinion issued in PCT/JP2017/018593; dated Aug. 8, 2017.

*Primary Examiner* — Khiem M Nguyen
(74) *Attorney, Agent, or Firm* — Studebaker & Brackett PC (57) ABSTRACT

A test coaxial connector has a probe portion with a small height, and prevents breakage of a switch-equipped coaxial connector even when the test coaxial connector is not properly fitted to the switch-equipped coaxial connector. The test coaxial connector includes a housing and a probe housed in the housing. The probe is formed of one continuous structure having elasticity, the structure including a contact at or near an end portion of the structure and including, at or near another end portion of the structure, a connection portion to which a central conductor of a coaxial cable is to be connected.

16 Claims, 6 Drawing Sheets

(56) References Cited

FOREIGN PATENT DOCUMENTS

| JP | 2011-119174 A | 6/2011 |
|---|---|---|
| WO | 2010/113536 A1 | 10/2010 |

\* cited by examiner

TEST COAXIAL CONNECTOR

CROSS-REFERENCE TO RELATED APPLICATIONS

This application claims benefit of priority to International Patent Application No. PCT/JP2017/018593, filed May 17, 2017, and to Japanese Patent Application No. 2016-105189, filed May 26, 2016, the entire contents of each are incorporated herein by reference.

BACKGROUND

Technical Field

The present disclosure relates to a test coaxial connector, and more specifically, relates to a test coaxial connector that has a probe portion with a small height and that prevents breakage of a switch-equipped coaxial connector even when the test coaxial connector is not properly fitted to the switch-equipped coaxial connector.

Background Art

As a method for connecting an electronic device and a measuring instrument in measuring characteristics of the electronic device, a method in which a switch-equipped coaxial connector provided to the electronic device and a test coaxial connector connected to the measuring instrument are fitted to each other, is widely used. More specifically, a switch-equipped coaxial connector is provided to a wiring portion of a board housed in an electronic device, the wiring portion being to be measured for electric characteristics. For example, in the case where the electronic device is a cellular phone, a switch-equipped coaxial connector is provided between a transmitting/receiving circuit formed on the board and an antenna by surface-mounting. The switch-equipped coaxial connector normally connects the transmitting/receiving circuit and the antenna.

When the test coaxial connector is fitted to the switch-equipped coaxial connector, the switch-equipped coaxial connector disconnects the transmitting/receiving circuit and the antenna from each other and newly connects the transmitting/receiving circuit and the test coaxial connector. As a result, the transmitting/receiving circuit of the cellular phone and the measuring instrument are connected to each other, so that it is possible to measure characteristics of the cellular phone by the measuring instrument.

Figure 6:
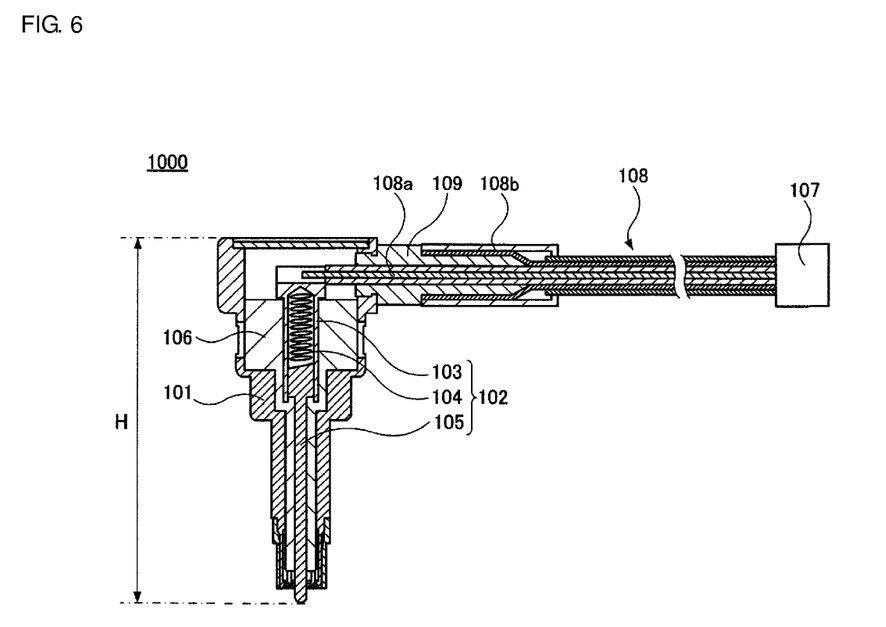
FIG. 6 is a cross-sectional view showing a test coaxial connector disclosed in International Publication No. WO2010/113536.

Such a test coaxial connector is disclosed in International Publication No. WO2010/113536. FIG. 6 shows a test coaxial connector 1000 disclosed in International Publication No. WO2010/113536.

The test coaxial connector 1000 has a structure in which a probe 102 is housed in a conductive housing 101. The probe 102 includes a conductive tubular barrel 103, and a coil spring 104 and a plunger (central terminal) 105 that are housed in a tubular portion of the barrel 103. The barrel 103 and the plunger 105 are electrically conducted to each other.

An insulating bushing 106 is provided between the housing 101 and the probe 102, whereby the housing 101 and the probe 102 are insulated from each other. A coaxial cable 108 connected to a measuring instrument 107 is connected to the test coaxial connector 1000. More specifically, a central conductor 108a of the coaxial cable 108 is connected to the plunger 105 via the barrel 103. In addition, a shield conductor 108b of the coaxial cable 108 is connected to the housing 101 via a conductive adapter 109.

Since the coil spring 104 is provided in the tubular portion of the barrel 103, the plunger 105 is retractable in the upward direction in the drawing. The reason why the plunger 105 is configured to be retractable is to prevent the plunger 105 from breaking a switch-equipped coaxial connector (not shown) due to unnecessary force applied from the plunger 105 to the switch-equipped coaxial connector, when the test coaxial connector 1000 is not properly fitted to the switch-equipped coaxial connector. That is, when the test coaxial connector 1000 is not properly fitted to the switch-equipped coaxial connector, the plunger 105 retracts in the upward direction due to shrinkage of the coil spring 104, thereby avoiding breakage of the switch-equipped coaxial connector.

In the test coaxial connector 1000, generally, the height of the probe 102 portion is large as indicated by reference sign H in FIG. 6 (reference sign H and a leader line therefor in FIG. 6 are added by the applicant for explanation, and are not shown in the drawing of International Publication No. WO2010/113536). The reason why the height H of the probe 102 portion of the test coaxial connector 1000 is made large is as follows.

Characteristics of an electronic device are measured during manufacture of the electronic device or after completion of the electronic device, and, in some cases, another electronic component having a large height is mounted around a switch-equipped coaxial connector mounted on a board. In this case, if the height H of the probe 102 portion is not large, the other electronic component becomes an obstacle and thus the test coaxial connector 1000 may not be successfully fitted to the switch-equipped coaxial connector.

In addition, when characteristics of the electronic device are measured after completion of the electronic device, a case of the electronic device in which the board is housed is detached before the measurement in some cases. In some cases, a measurement hole is formed in the case in advance, and the probe 102 portion is inserted into the measurement hole before the measurement. In order to insert the probe 102 portion into the measurement hole and conduct the measurement, the height H of the probe 102 portion has to be large.

Due to the above reason, the height H of the probe 102 portion of the test coaxial connector 1000 is made large.

SUMMARY

In measurement of characteristics of the electronic device, in order to achieve high measurement accuracy, it is necessary to conduct the measurement under the same conditions as in an actual use state. Therefore, in a state where the case of the electronic device is detached, high measurement accuracy is not achieved in some cases. Also, when a measurement hole is provided in the case for measurement of characteristics, a problem that waterproofness of the electronic device is not maintained, a problem that the measurement hole is not preferable in terms of appearance, and the like arise.

Therefore, a method is conceivable in which a test coaxial connector is fitted to a switch-equipped connector provided to a board housed in a case, a coaxial cable is drawn to the outside from a gap of the case, and characteristic measurement is conducted. For this measurement, the height of the probe portion of the test coaxial connector has to be small.

For example, in the test coaxial connector 1000, in order to decrease the height H of the probe 102 portion, first, it is necessary to decrease the length of the plunger (central terminal) 105. Next, the other portion is desired to be made smaller, but, in the test coaxial connector 1000, it is impossible to decrease the length of the tubular portion of the barrel 103, since the coil spring 104 is housed in the tubular portion of the barrel 103.

In addition, in order to decrease the height H of the probe 102 portion, it is also conceivable to omit the coil spring 104. However, in this case, if the test coaxial connector 1000 is not properly fitted to the switch-equipped coaxial connector, the switch-equipped coaxial connector is broken. Thus, it is impossible to adopt omission of the coil spring 104.

Specifically, in the structure of the existing test coaxial connector 1000, it is difficult to decrease the height of the probe portion to such a degree that, while the function to prevent breakage of a switch-equipped coaxial connector when the test coaxial connector 1000 is not properly fitted to the switch-equipped coaxial connector is maintained, it is possible to fit the test coaxial connector 1000 to a switch-equipped connector provided to a board housed in a case and to conduct measurement.

The present disclosure has been made to provide a test coaxial connector that is fitted to a switch-equipped coaxial connector when being used, and includes a housing and a probe housed in the housing. The probe is formed of one continuous structure having elasticity, the structure including a contact at or near an end portion thereof and including, at or near another end portion thereof, a connection portion to which a central conductor of a coaxial cable is to be connected.

A bent portion may be provided between the contact and the connection portion of the probe. In this case, it is possible to exhibit elasticity (spring property) by the bent portion.

A zigzag portion may be provided between the contact and the connection portion of the probe. In this case, it is possible to exhibit elasticity by the zigzag portion.

The probe may include a portion having a different diameter or thickness, between the contact and the connection portion. In this case, it is possible to exhibit elasticity by a portion having a small diameter or a portion having a small thickness.

The contact of the probe may be curled. In this case, it is possible to exhibit elasticity by the curled contact.

In the test coaxial connector of the present disclosure, since the probe is formed from one continuous structure, it is possible to decrease the height of the probe portion. In addition, since the probe has elasticity, even when the test coaxial connector of the present disclosure is not properly fitted to the switch-equipped coaxial connector, the test coaxial connector does not break the switch-equipped coaxial connector.

DETAILED DESCRIPTION

Hereinafter, modes for carrying out the present disclosure will be described with reference to the drawings.

Each embodiment represents an embodiment of the present disclosure, and the present disclosure is not limited to the contents of the embodiments. In addition, the contents described in different embodiments may be combined and implemented, and the implementation contents in that case are also included in the present disclosure. The drawings are provided to help the understanding of the embodiments, and the drawings may not be necessarily illustrated strictly. For example, the ratios of dimensions of the illustrated components or the ratio of dimensions between the components may not correspond to the ratios of dimensions of those described in the specification. The components described in the specification may be omitted in the drawings, or some of the components may be omitted in the drawings.

First Embodiment

Figure 1A:
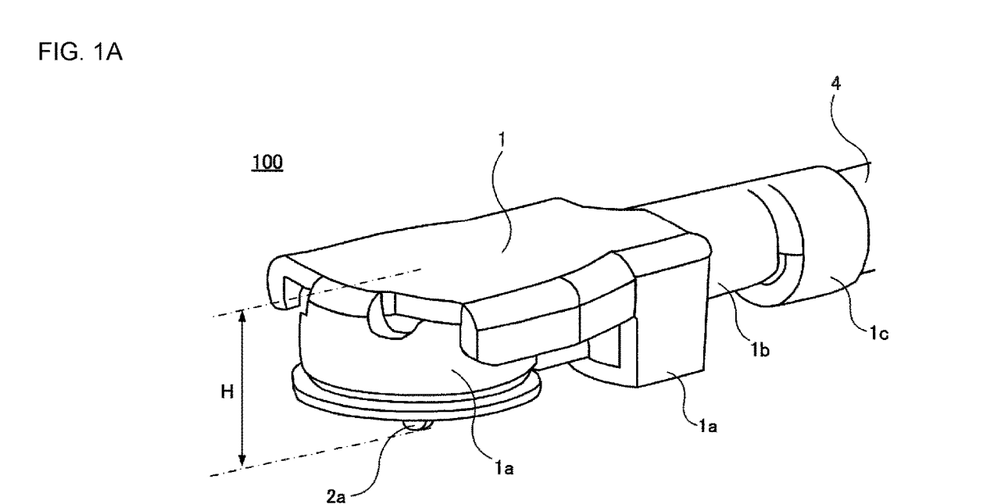
FIG. 1A is a perspective view showing a test coaxial connector according to a first embodiment.
Figure 1B:
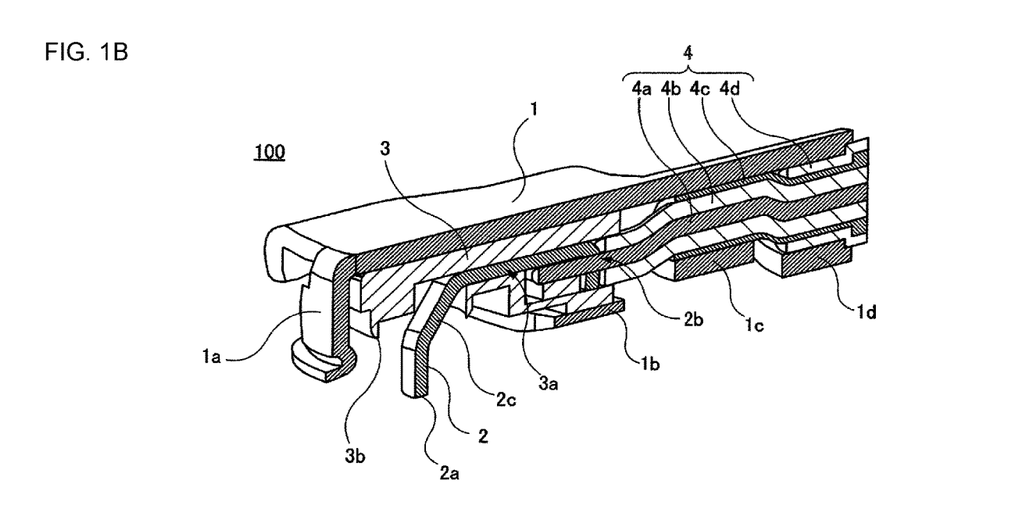
FIG. 1B is an exploded perspective view showing the test coaxial connector.

FIGS. 1A and 1B show a test coaxial connector 100 according to a first embodiment. FIG. 1A is a perspective view of the test coaxial connector 100, and FIG. 1B is an exploded perspective view of the test coaxial connector 100.

The test coaxial connector 100 includes a conductive housing 1. The housing 1 is produced from, for example, beryllium copper. A tubular fitting portion 1a for fitting to a switch-equipped connector (not shown) is formed at a front portion of the housing 1.

Figure 2A:
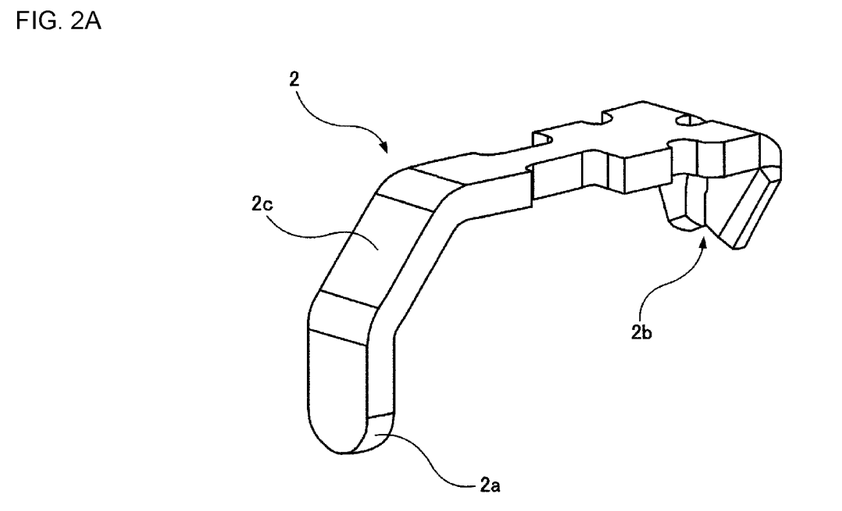
FIGS. 2A and 2B are each a perspective view showing a probe of the test coaxial connector.
Figure 2B:
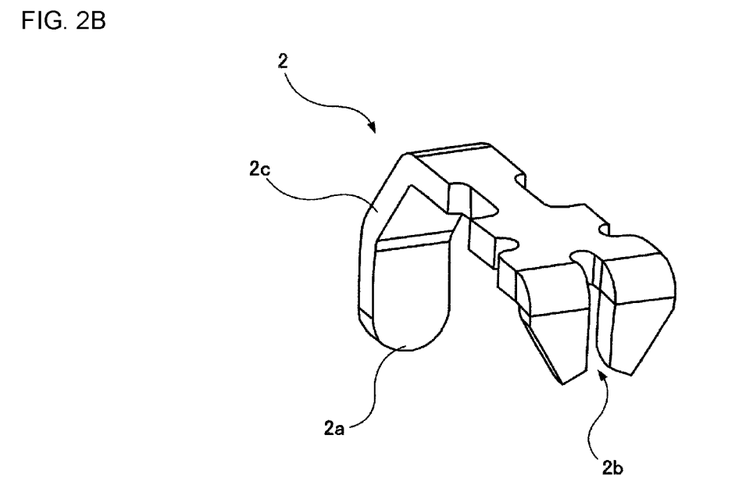

The test coaxial connector 100 includes a conductive probe (central terminal) 2. FIGS. 2A and 2B show the probe 2. FIG. 2A is a perspective view of the probe 2 as seen from the front side, and FIG. 2B is a perspective view of the probe 2 as seen from the rear side.

The probe 2 is produced from, for example, one plate-shaped beryllium copper. The probe 2 has a contact 2a at a front portion thereof. In addition, the probe 2 has a cut 2b as a connection portion for connecting a central conductor 4a of a later-described coaxial cable 4, at a rear portion thereof. Furthermore, a bent portion 2c is provided between the contact 2a and the cut 2b of the probe 2 is provided by the probe 2 being bent at two locations. Since the bent portion 2c is provided, the probe 2 exhibits elasticity (spring property).

The probe 2 is attached to an insulting member 3 formed from a resin. More specifically, a groove 3a is formed on the insulting member 3, and the probe 2 is press-fitted into the groove 3a.

On the insulting member 3, a tapered annular guide 3b that is used for positioning in fitting the test coaxial connector 100 to the switch-equipped connector is further formed at a front portion thereof. The insulting member 3 to which the probe 2 is attached is crimped with a claw 1b provided in the housing 1, and thereby attached to the housing 1.

The coaxial cable 4 connected to a measuring instrument (not shown) is connected to the test coaxial connector 100. The coaxial cable 4 is configured to have a four-layer structure having the central conductor 4a, a first insulating layer 4b covering the central conductor 4a, a shield conductor 4c covering the first insulating layer 4b, and a second insulating layer 4d covering the shield conductor 4c.

The central conductor 4a of the coaxial cable 4 is fitted into the cut 2b of the probe 2 and thereby fixed and electrically connected. The shield conductor 4c of the coaxial cable 4 is crimped with a claw 1c provided in the housing 1, and thereby fixed and electrically connected to the housing 1. Furthermore, the entire coaxial cable 4 is crimped with a claw 1d provided in the housing 1, and thereby fixed to the housing 1.

In the test coaxial connector 100 having the above structure according to the present embodiment, the probe 2 is composed of only one structure without using a barrel or a coil spring, and thus it is possible to decrease the height H of the probe 2 portion shown in FIG. 1A. In addition, in the test coaxial connector 100, the bent portion 2c is provided by the probe 2 being bent at two locations, and thus the probe 2 has elasticity (spring property). Therefore, when the test coaxial connector 100 is not properly fitted to the switch-equipped coaxial connector, the contact 2a of the probe 2 retracts in the upward direction owing to the elasticity, so that it is possible to avoid breakage of the switch-equipped coaxial connector.

It is possible to produce the test coaxial connector 100 having the above structure according to the present embodiment, for example, by the following method.

First, the central conductor 4a of the coaxial cable 4 is fitted into the cut 2b of the probe 2, and thereby fixed and electrically connected.

Next, the probe 2 is press-fitted into the groove 3a of the insulting member 3 and thereby attached.

Next, the insulating member 3 to which the probe 2 has been attached is crimped with the claw 1b and thereby attached to the housing 1.

Next, the shield conductor 4c of the coaxial cable 4 is crimped with the claw 1c and thereby electrically connected to the housing 1.

Finally, the entire coaxial cable 4 is crimped with the claw 1d and thereby attached to the housing 1, whereby the test coaxial connector 100 is completed.

Figure 3A:
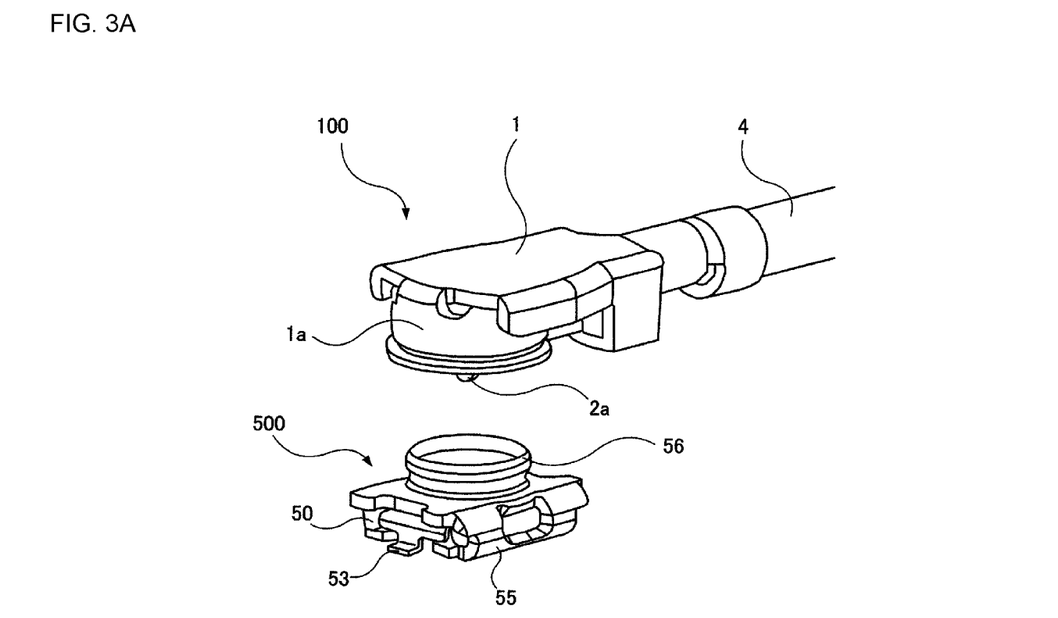
FIG. 3A is a perspective view showing a state before the test coaxial connector is fitted to a switch-equipped coaxial connector.
Figure 3B:
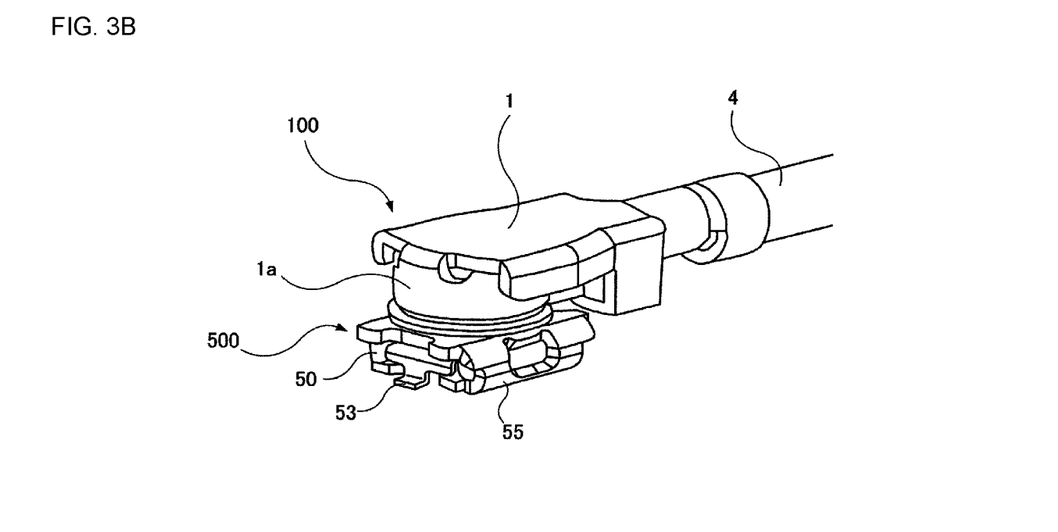
FIG. 3B is a perspective view showing a state after the test coaxial connector is fitted to the switch-equipped coaxial connector.
Figure 4A:
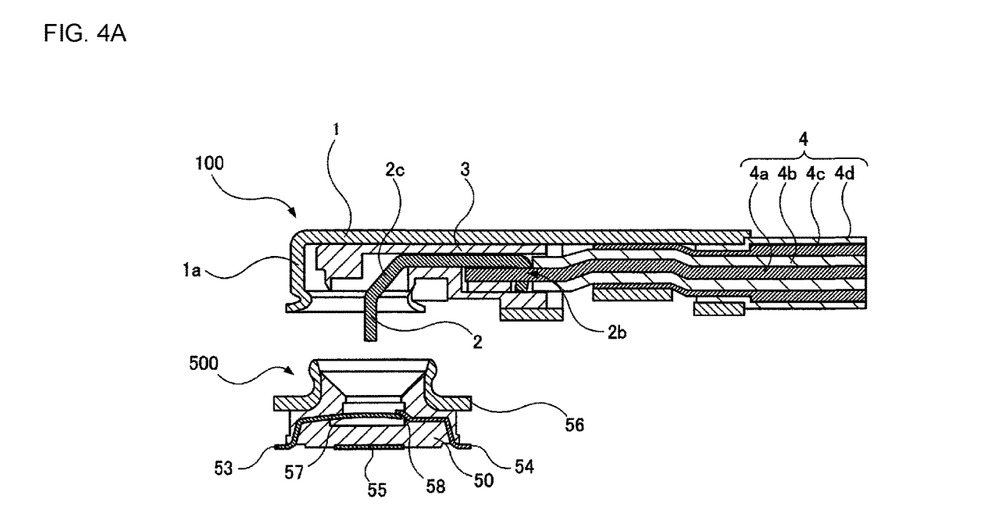
FIG. 4A is a cross-sectional view showing the state before the test coaxial connector is fitted to the switch-equipped coaxial connector.
Figure 4B:
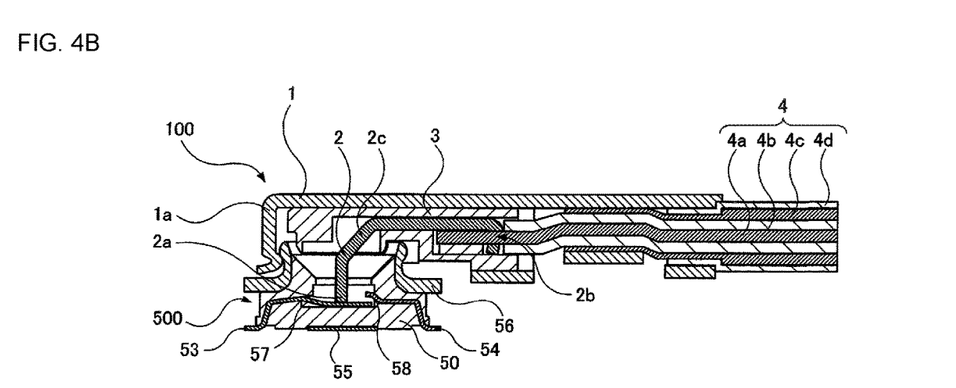
FIG. 4B is a cross-sectional view showing the state after the test coaxial connector is fitted to the switch-equipped coaxial connector.

Next, an example of a method for using the test coaxial connector 100, that is, an example of a method for fitting the test coaxial connector 100 to a switch-equipped coaxial connector (receptacle) 500, will be described with reference to FIGS. 3A, 3B, 4A, and 4B. FIG. 3A is a perspective view showing a state before the test coaxial connector 100 is fitted to the switch-equipped coaxial connector 500. FIG. 3B is a perspective view showing a state after the test coaxial connector 100 is fitted to the switch-equipped coaxial connector 500. FIG. 4A is a cross-sectional view showing the state before the test coaxial connector 100 is fitted to the switch-equipped coaxial connector 500. FIG. 4B is a cross-sectional view showing the state after the test coaxial connector 100 is fitted to the switch-equipped coaxial connector 500. In the drawings, the reference signs for the components that are not relevant to the description in this part may be omitted.

The test coaxial connector 100 is fitted to the switch-equipped coaxial connector 500. The switch-equipped coaxial connector 500 is an element that is not included in the present disclosure. The switch-equipped coaxial connector 500 is surface-mounted on a land electrode, which is formed on a board (not shown) housed in an electronic device, by means of solder reflow or the like.

The switch-equipped coaxial connector 500 includes a case 50 formed from a resin. A first terminal electrode 53, a second terminal electrode 54, and a third terminal electrode 55 are formed on the bottom surface of the case 50. The first terminal electrode 53 is connected to a transmitting/receiving circuit of the electronic device. The second terminal electrode 54 is connected to an antenna of the electronic device. The third terminal electrode 55 is connected to ground of the electronic device.

A conductive and tubular fitting portion 56 for fitting to the fitting portion 1a of the test coaxial connector 100 is formed on the upper surface of the switch-equipped coaxial connector 500. The fitting portion 56 is connected to the third terminal electrode 55.

In a space within the fitting portion 56, a movable terminal 57 and a fixed terminal 58 are disposed. The movable terminal 57 is formed so as to be integrated with the first terminal electrode 53. In addition, the fixed terminal 58 is formed so as to be integrated with the second terminal electrode 54. As shown in FIG. 4A, when the test coaxial connector 100 is not fitted to the switch-equipped coaxial connector 500, the movable terminal 57 and the fixed terminal 58 are connected to each other. As a result, when the test coaxial connector 100 is not fitted to the switch-equipped coaxial connector 500, the transmitting/receiving circuit and the antenna of the electronic device are connected to each other via a path connecting the first terminal electrode 53, the movable terminal 57, the fixed terminal 58, and the second terminal electrode 54.

Also, as shown in FIG. 4B, when the fitting portion 56 is fitted to the fitting portion 1a such that the test coaxial connector 100 is fitted to the switch-equipped coaxial connector 500, the contact 2a of the probe 2 presses down the movable terminal 57, so that the movable terminal 57 and the fixed terminal 58 become disconnected from each other and the movable terminal 57 and the probe 2 become connected to each other. As a result, the transmitting/receiving circuit and the antenna of the electronic device become disconnected from each other, and the transmitting/receiving circuit and the measuring instrument become connected to each other via a path connecting the first terminal electrode 53, the movable terminal 57, the probe 2, and the central conductor 4a of the coaxial cable 4.

As described above, in the probe 2 of the present embodiment, the bent portion 2c is formed by the probe 2 being bent at two locations, so that the probe 2 has elasticity (spring property). Thus, if the positions of the switch-equipped coaxial connector 500 and the test coaxial connector 100 are displaced such that the switch-equipped coaxial connector 500 and the test coaxial connector 100 are not properly fitted to each other, the probe 2 retracts upward at the time when the probe 2 comes into contact with a portion other than the movable terminal 57 of the switch-equipped coaxial connector 500, so that breakage of the switch-equipped coaxial connector 500 by the probe 2 is prevented.

Hereinafter, second to sixth embodiments will be described. In each of the second to sixth embodiments, the shape of the probe 2 of the test coaxial connector 100 according to the first embodiment is changed. The other components of the second to sixth embodiments are the same as those of the first embodiment. Therefore, only the probe is shown in the drawing showing each embodiment.

Second Embodiment

FIG. 5 shows a probe 22 of a test coaxial connector according to the second embodiment.

Figure 5A:
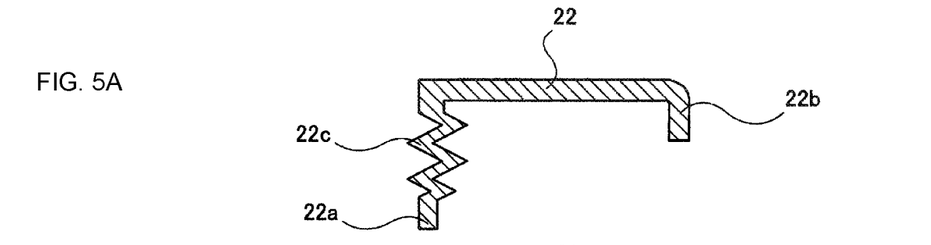
FIGS. 5A to 5E are cross-sectional views showing probes according to second to sixth embodiments, respectively.

In the probe 22, a zigzag portion 22c is formed between a contact 22a and a cut 22b for connecting the shield conductor 4c of the coaxial cable 4. The probe 22 has elasticity (spring property) since the zigzag portion 22c is formed in the probe 2.

Third Embodiment

Figure 5B:
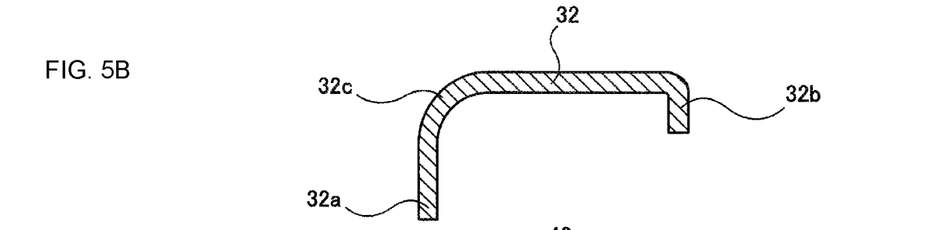

FIG. 5B shows a probe 32 of a test coaxial connector according to the third embodiment.

In the probe 32, a rounded bent portion 32c is formed between a contact 32a and a cut 32b. The probe 32 has elasticity since the rounded bent portion 32c is formed in the probe 22.

Fourth Embodiment

Figures 5C, 5D:
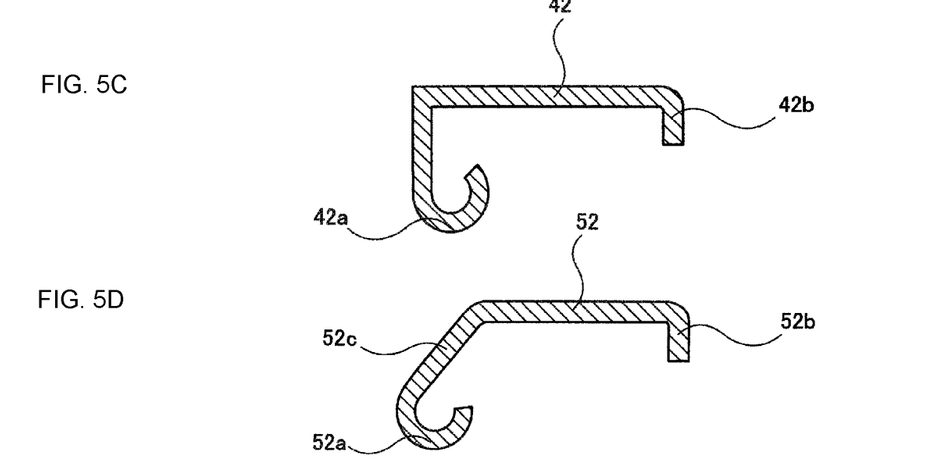

FIG. 5C shows a probe 42 of a test coaxial connector according to the fourth embodiment.

In the probe 42, a contact 42a is formed in a curled shape. The probe 42 has elasticity since the contact 42a is formed in a curled shape. The contact 42a of the probe 42 is not formed at an end portion of the probe 42 but formed near the end portion.

Fifth Embodiment

FIG. 5D shows a probe 52 of a test coaxial connector according to the fifth embodiment.

In the probe 52, a bent portion 52c is formed between a contact 52a and a cut 52b, and the contact 52a is formed in a curled shape. The probe 52 has elasticity since the bent portion 52c is formed in the probe 52 and the contact 52a is formed in a curled shape. The contact 52a of the probe 52 is not formed at an end portion of the probe 52 but formed near the end portion.

Sixth Embodiment

Figure 5E:
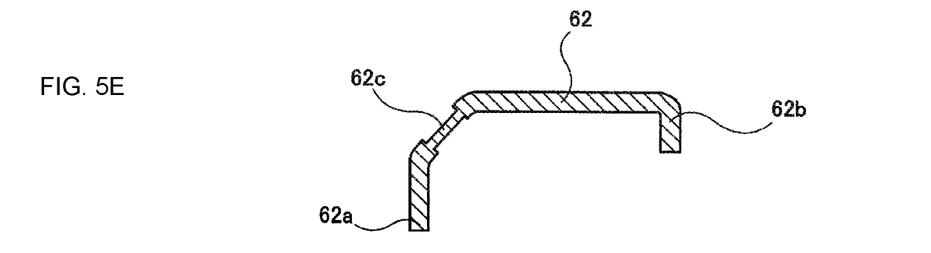

FIG. 5E shows a probe 62 of a test coaxial connector according to the sixth embodiment.

In the probe 62, a bent portion 62c is formed between a contact 62a and a cut 62b, and the thickness of the bent portion 62c is smaller than that of the other portions. The probe 62 has elasticity since the bent portion 62c is formed in the probe 62 and the thickness of the bent portion 62c is smaller.

The embodiments of the present disclosure have been described above. However, the present disclosure is not limited to the above contents, and various modifications may be made according to the principles of the present disclosure.

For example, in the first to sixth embodiments, the probes 2 to 62 are formed of plate-like structures, but may be formed of rod-like structures instead.

What is claimed is:

1. A test L-shaped coaxial connector which is fitted to a switch-equipped coaxial connector when being used, the test L-shaped coaxial connector comprising:
a housing;
an insulator attached to the housing; and
a probe housed in the housing, wherein
the probe is formed of one continuous structure having elasticity, the structure including
a contact, at or near an end portion of the probe,
a connection portion, at or near another end portion of the probe, to which a central conductor of a coaxial cable is to be connected, the connection portion formed by the probe being bent at least at one location,
a bent portion provided between the contact and the connection portion by the probe being bent at least a first bend and a second bend, the first bend being positioned closer to the connection portion, and
a flat portion extending the whole length between the connection portion and the first bend of the bent portion, the entire flat portion being in contact with the insulator in a direction opposite to a direction of fitting to the switch-equipped coaxial connector.

2. The test L-shaped coaxial connector according to claim 1, wherein a zigzag portion is provided between the contact and the connection portion of the probe.

3. The test L-shaped coaxial connector according to claim 1, wherein the probe includes a portion having a different diameter or thickness, between the contact and the connection portion.

4. The test L-shaped coaxial connector according to claim 1, wherein the contact of the probe is curled.

5. The test L-shaped coaxial connector according to claim 2, wherein the probe includes a portion having a different diameter or thickness, between the contact and the connection portion.

6. The test L-shaped coaxial connector according to claim 2, wherein the contact of the probe is curled.

7. The test L-shaped coaxial connector according to claim 3, wherein the contact of the probe is curled.

8. The test L-shaped coaxial connector according to claim 5, wherein the contact of the probe is curled.

9. A test L-shaped coaxial connector which is fitted to a switch-equipped coaxial connector when being used, the test L-shaped coaxial connector comprising:
a housing;
an insulator attached to the housing; and
a probe housed in the housing, wherein
the probe is formed of one continuous structure having elasticity, the structure including a contact at or near an end portion thereof and including, at or near another end portion thereof, a connection portion to which a central conductor of a coaxial cable is to be connected,
a bent portion is provided between the contact and the connection portion of the probe by the probe being bent at least at two locations,
a portion between the connection portion and the bent portion is in contact with the insulator in a direction opposite to a direction of fitting to the switch-equipped coaxial connector, and
the connection portion includes a cut into which the central conductor of the coaxial cable is fitted.

10. The test L-shaped coaxial connector according to claim 9, wherein a zigzag portion is provided between the contact and the connection portion of the probe.

11. The test L-shaped coaxial connector according to claim 9, wherein the probe includes a portion having a different diameter or thickness, between the contact and the connection portion.

12. The test L-shaped coaxial connector according to claim 9, wherein the contact of the probe is curled.

13. The test L-shaped coaxial connector according to claim 10, wherein the probe includes a portion having a different diameter or thickness, between the contact and the connection portion.

14. The test L-shaped coaxial connector according to claim 10, wherein the contact of the probe is curled.

15. The test L-shaped coaxial connector according to claim 11, wherein the contact of the probe is curled.

16. The test L-shaped coaxial connector according to claim 13, wherein the contact of the probe is curled.

* * * * *